United States Patent [19]
Flint et al.

[11] Patent Number: 4,457,661
[45] Date of Patent: Jul. 3, 1984

[54] WAFER LOADING APPARATUS

[75] Inventors: Alan G. Flint, Los Gatos; William G. Jacobs, San Jose, both of Calif.

[73] Assignee: Applied Materials, Inc., Santa Clara, Calif.

[21] Appl. No.: 328,408

[22] Filed: Dec. 7, 1981

[51] Int. Cl.³ ............................................. B65G 65/00
[52] U.S. Cl. ..................................... 414/404; 414/417; 414/752; 118/729
[58] Field of Search ................ 118/729, 730; 414/217, 414/222, 225, 331, 404, 416, 417, 752

[56] References Cited

U.S. PATENT DOCUMENTS

| | | | |
|---|---|---|---|
| 1,377,027 | 5/1921 | Pettit | 369/189 |
| 2,501,391 | 3/1950 | Karp | 369/195 |
| 3,554,391 | 1/1971 | Goodell | 414/331 |
| 3,719,166 | 12/1973 | Gereth | 118/730 X |
| 3,865,072 | 2/1975 | Kirkman | 118/730 X |
| 4,009,785 | 3/1977 | Trayes | 414/752 X |
| 4,306,731 | 12/1981 | Shaw | 279/4 |
| 4,311,427 | 1/1982 | Coad et al. | 414/217 |
| 4,344,383 | 8/1982 | Salt, Jr. | 118/730 |

FOREIGN PATENT DOCUMENTS 53-75866  7/1978  Japan ..................................... 414/416

OTHER PUBLICATIONS

Kehagiouglou, IBM Technical Disclosure Bulletin: Wafer Transfer Systems, Apr. 1976, vol. 18, No. 11, pp. 3696-3697.

Primary Examiner—Leslie J. Paperner
Assistant Examiner—Ken Muncy
Attorney, Agent, or Firm—Flehr, Hohbach, Test, Albritton & Herbert

[57] ABSTRACT

Apparatus for transferring wafers between storage magazines and processing trays. The trays are mounted on a generally cylindrical carousel which is rotated about its axis to bring successive ones of the trays into position for loading wafers on to the trays and unloading wafers from the trays. An elevator assembly is mounted within the carousel and is moveable in an axial direction for alignment with different wafer holding positions which are spaced along the trays. The storage magazines are mounted on the elevator assembly, and wafer transfer blades transfer the wafers between the magazines and radially moveable chucks which carry the wafers to and from the wafer holding positions in the trays.

21 Claims, 9 Drawing Figures

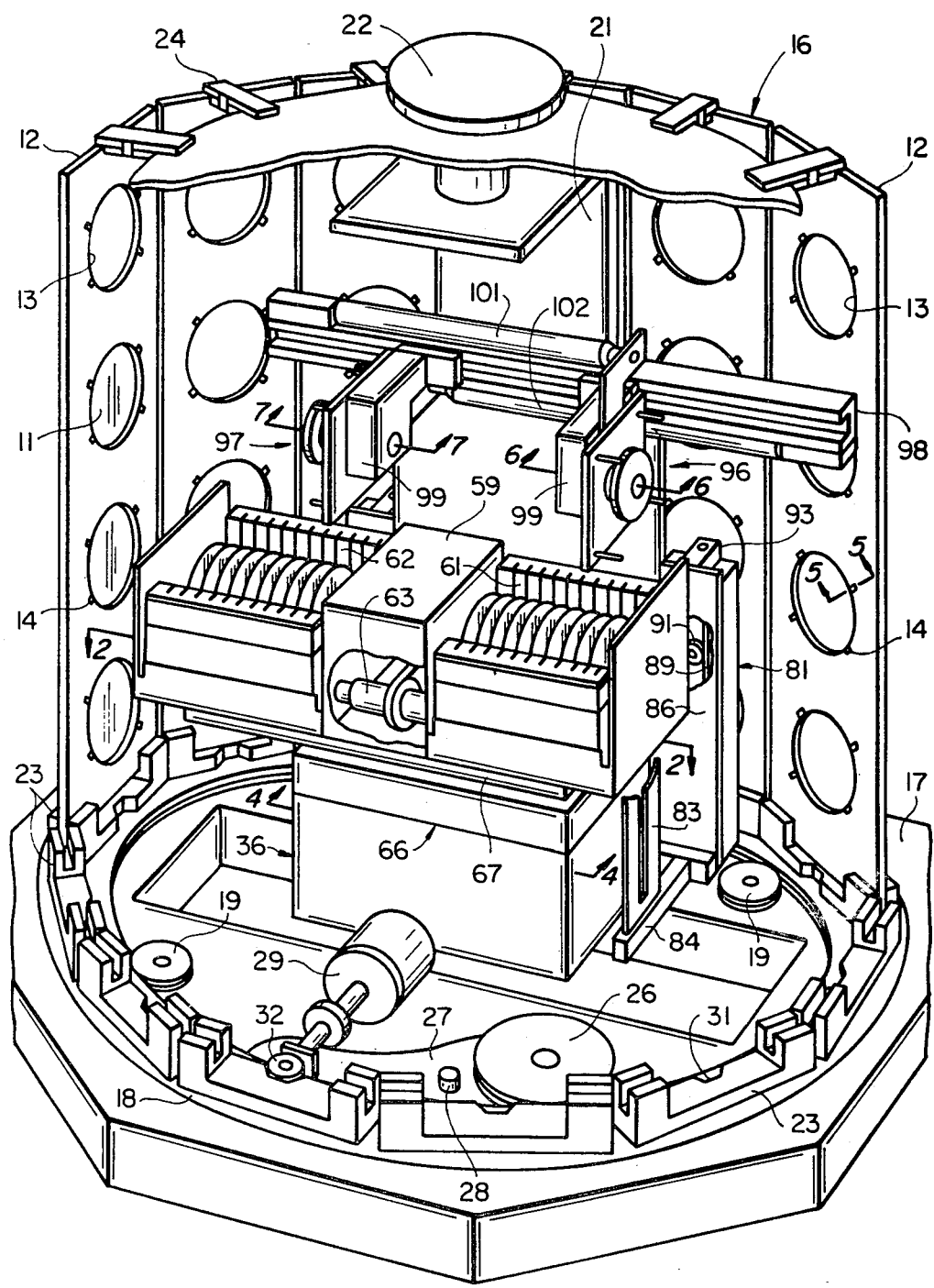
FIG_1

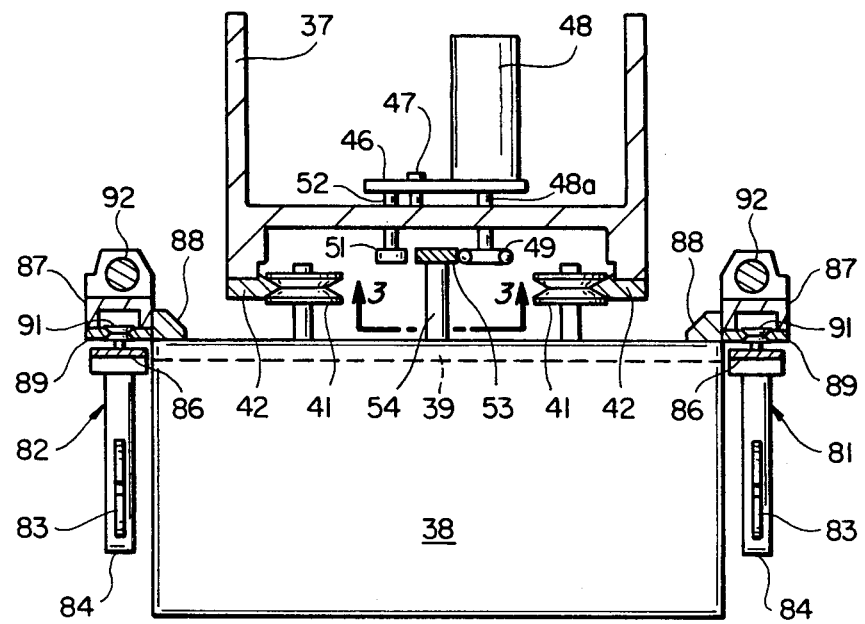
FIG_2
FIG_3

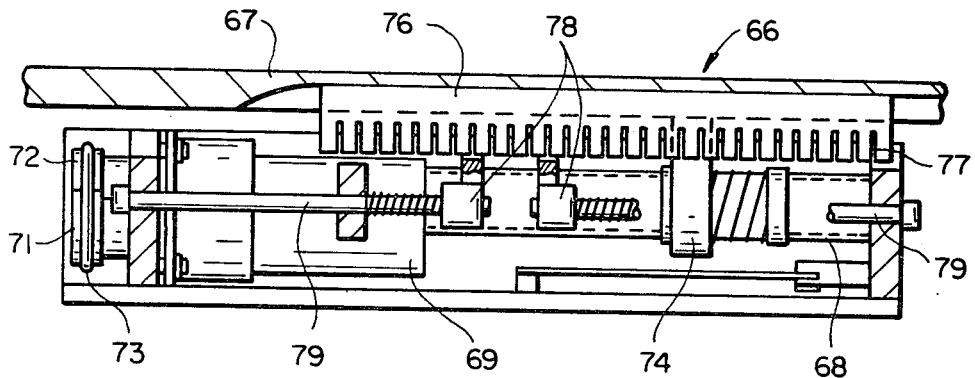
FIG_4
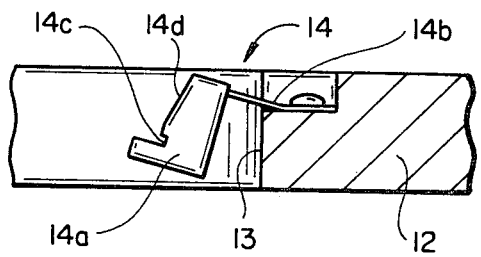
FIG_5
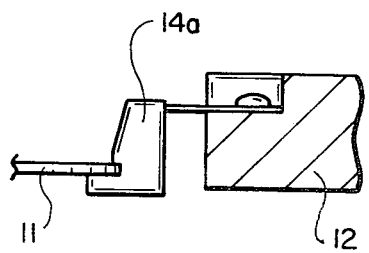
FIG_5A
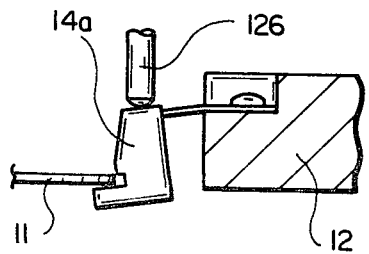
FIG_5B

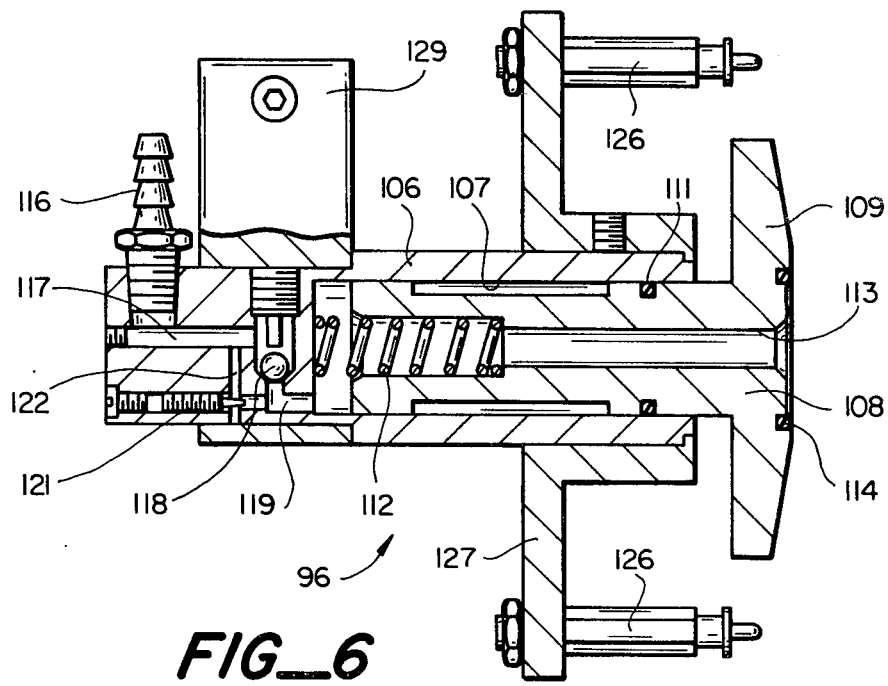
FIG_6
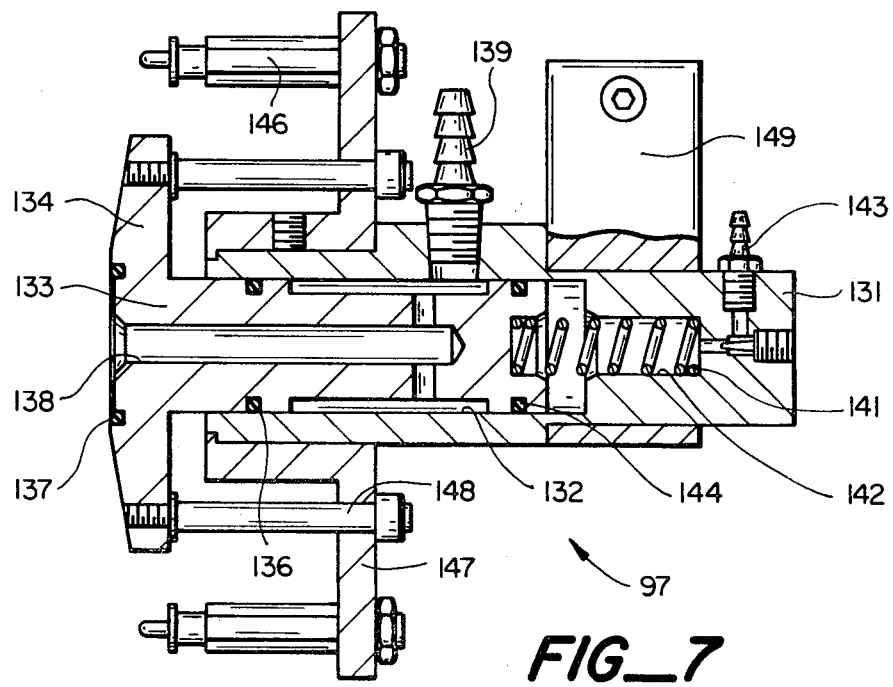
FIG_7

WAFER LOADING APPARATUS

This invention pertains generally to the manufacture of semiconductors, and more particularly to apparatus for loading wafers into trays for processing, for example, in a plasma etching reactor and for unloading the wafers from the trays.

In the manufacture of semiconductors, wafers are commonly kept in cassettes or other suitable storage devices, transferred from the cassettes to processsing chambers, and returned to the cassettes after processing. The rate at which the wafers can be processed is often limited by the rate at which they can be transferred into and out of the processing chamber. Throughout the process, it is important that contamination of the wafers be avoided.

In some systems heretofore provided for processing wafers in batches, the wafers are loaded manually onto trays or into holders such as boats, utilizing tweezers to minimize contamination of the wafers. This method of loading and unloading is inherently slow, and it requires each wafer to be handled twice by an operator. While there have been some attempts to automate the loading and unloading of wafers for processing in groups or batches, the systems heretofore provided for this purpose have had limitations and disadvantages.

It is in general an object of the invention to provide new and improved apparatus for transferring wafers between storage magazines and processing trays.

Another object of the invention is to provide apparatus of the above character in which handling of the wafers by an operator is eliminated.

Another object of the invention is to provide apparatus of the above character which permits one batch of wafers to be loaded and/or unloaded while another is being processed so that the rate at which the wafers can be processed is not limited by the loading and unloading operations.

Another object of the invention is to provide apparatus of the above character in which the face of the wafer remains vertical at all times during loading, unloading and processing to prevent particulates from contaminating the devices.

Another object of the invention is to provide apparatus of the above character in which all of the wafers move the same distance from the cassette to the tray regardless of their position in the cassette or their location in the tray, thereby enabling fixed positive strokes to be employed by the mechanism by which the wafers are transferred between the cassette and the tray.

Another object of the invention is to provide apparatus of the above character in which the casette assembly moves relative to the tray being loaded or unloaded to minimize the wafer transport distance between the cassette and the tray and to reduce the wafer travel time.

Another object of the invention is to provide apparatus of the above character in which a single indexing mechanism is shared by both the loading and unloading cassettes.

Another object of the invention is to provide apparatus of the above character in which contact with the wafers is minimized.

Another of the invention is to provide apparatus of the above character utilizing a compound acting loader chuck which retracts under vacuum and extends in atmosphere, with the wafer itself being utilized as a sealing member when the vacuum is applied.

Another object of the invention is to provide apparatus of the above character having separate loading and unloading stations, with no mixing of processed and unprocessed wafers in the same cassette.

Another object of the invention is to provide apparatus of the above character in which one complete batch of processed wafers can be unloaded into a cassette before beginning a loading cycle, whereby the mixing of wafers and processing trays can be avoided.

Another object of the invention is to provide apparatus of the above character in which two complete sets of trays from a processing reactor can be stored on the carousel while the reactor is being serviced.

Another object of the invention is to provide apparatus of the above character which is relatively compact and requires a minimum of floor space.

These and other objects are achieved in accordance with the invention by loading the wafers onto trays having a plurality of wafer holding positions spaced side by side thereon. A plurality of the trays are placed on a generally cylindrical carousel with the wafer holding positions on each tray aligned in a direction generally parallel to the axis of the carousel. The carousel is then rotated about its axis to bring different ones of the trays into loading and unloading positions. An elevator assembly is mounted within the carousel for movement in the axial direction between the wafer holding positions, and wafer-holding chucks are mounted on the elevator assembly for movement in radial directions toward and from the trays in the loading and unloading positions. Storage magazines for the wafers are mounted on the elevator assembly, and means is included for transfering successive ones of the wafers between the magazines and the chucks. The wafers are held on the trays by releasable clips, and the chucks include means for actuating the clips to permit the wafers to be loaded onto and removed from the trays.

FIG. 1 is an isometric view, partly broken away, of one embodiment of wafer loading apparatus according to the invention.

FIG. 2 is a fragmentary sectional view, somewhat schematic, taken along line 2—2 in FIG. 1.

FIG. 3 is an enlarged fragmentary view, partly broken away, taken along 3—3 in FIG. 2.

FIG. 4 is an enlarged fragmentary sectional view, partly broken away, taken along line 4—4 in FIG. 1.

FIG. 5 is an enlarged fragmentary sectional view taken along 5—5 in FIG. 1.

FIGS. 5A and 5B are operational views of the wafer holding clip illustrated in FIG. 5.

FIG. 6 is an enlarged fragmentary sectional view taken along line 6—6 in FIG. 1.

FIG. 7 is an enlarged fragmentary sectional view taken along line 7—7 in FIG. 1.

As illustrated in FIG. 1, wafers 11 are loaded into and removed from processing trays 12. The wafers are conventional semiconductor wafers, such as silicon wafers, of any desired size and shape. Trays 12 are elongated, generally rectangular trays having a plurality of wafer holding positions 13 spaced in a side by side manner along the axes thereof. In the embodiment illustrated, each tray has four wafer holding positions spaced along its axis. Each wafer holding position comprises an opening in the tray of slightly larger diameter than the wafer to be held, with four clips 14 disposed in quadrature around the opening for holding the wafer by the edge portion thereof.

For loading and unloading of the wafers, processing trays 12 are removably mounted on a multifaceted generally cylindrical carousel 16 which is rotatively mounted on a base 17. The carousel comprises an annular base plate 18 which is rotatively supported on the base by guide rollers 19. These rollers are rotatively mounted on vertical posts on base 17, and they have V-grooves which receive a mating flange on the inner periphery of ring 18. The carousel also includes a central column 21 on which a cover 22 is mounted in spaced relationship above the base ring. The processing trays are disposed about the outer periphery of the carousel with their axes parallel to the axis of the coursel in the multifaceted structure. In the embodiment illustrated, the carousel has 12 facets or tray receiving positions, and wafers can be loaded into one set of six trays and unloaded from a second set of six trays while the wafers in a third set of six trays are being processed in a reactor. The lower portions of the trays are received in tray-holding brackets 23 mounted on base ring 18, and the upper portions of the trays are releasably held by clips 24 mounted on cover 22.

Means is provided for rotating the carousel about its axis to bring successive ones of the trays into the wafer loading and unloading positions. This means includes a friction drive wheel 26 engageable with the inner periphery of base ring 18. This wheel is driven by an electric motor (not shown) which is mounted in base 17. The drive wheel is mounted on a base plate 27 which is moveable about a pivot 28 whereby the drive wheel can be moved into and out of engagement with the carousel ring. Engagement of the drive wheel is controlled by a air cylinder 29 operatively connected to base plate 27. Means is included for locking the carousel in the loading and unloading positions. This means includes detent notches 31 in tray brackets 23 and a detent roller 32 carried by base plate 27. The relationship of drive wheel 26 and roller 32 is such that when the drive wheel is in driving engagement with the carousel ring, the roller is withdrawn from the detent notches so that the carousel can turn freely. Likewise, when the detent roller is engaged, the drive wheel is withdrawn from the drive ring.

An elevator assembly 36 is mounted on base 17 for movement along the axis of the carousel. This assembly includes an upstanding column 37 which is affixed to the base and has a generally H-shaped cross section, as illustrated in FIG. 2. A carriage assembly 38 having a back plate 39 is mounted on the column for movement in the vertical direction by means of guide rollers 41 which are rotatively mounted on the back plate of the carriage and engage vertically extending rails 42 affixed to the front edges of the side plates of column 37.

A drive motor and detent assembly for the elevator is mounted on column 37. This assembly includes a base plate 46 which is pivotally mounted on the web portion of the column by means of a pivot 47. A drive motor 48 is mounted on plate 46, and a friction drive roller 49 is mounted on the output shaft of this motor. A detent roller 51 is mounted on a post 52 which, with motor shaft 48a, extends through a suitable opening (not shown) in the column.

Friction drive roller 49 and detent roller 51 are engageable with opposite sides of a vertically extending bar 53 which is affixed to the back plate 39 of the elevator carriage by mounting posts 54. The drive bar has a plurality of detent notches 56 spaced along one side thereof in positions corresponding to the wafer holding positions on the processing trays. A pneumatic cylinder 57 is operatively connected to base plate 46 for selectively moving the drive motor assembly between the driving position illustrated in full lines in FIG. 3 and the detent position illustrated in phantom lines in FIG. 3. In the driving position, drive roller 49 engages drive bar 53, and detent roller 51 is withdrawn from detent notches 56. In the detent position, the detent roller is received in one of the notches, and the drive roller is disengaged from the drive bar.

The cassettes or storage magazines from which the wafers are loaded onto the trays and to which the wafers are returned from the trays are removably mounted on the carriage of the elevator assembly in a cassette holder 59. In the embodiment illustrated, an input cassette 61 containing the wafers to be loaded is mounted on one side of the carriage, and an output cassette 62 which receives the wafers removed from the trays is mounted on the other side of the carriage. The cassette holder includes a rotatively driven roller 63 which extends through the lower portion of the loader cassette 61 and engages the edges of the wafers to rotate the wafers until their flat edge portions are facing in the downward direction. Thus, the wafers are automatically oriented to a predetermined position within the cassette.

An indexing assembly 66 is mounted on the elevator carriage beneath cassette holder 59 for moving the cassettes or storage magazines longitudinally of the carriage to bring successive ones of the wafers in cassettes 61 into position for loading and to bring successives ones of the wafer receiving positions or slots in cassettes 62 into position for receiving wafers as they are unloaded from the trays. This assembly includes a horizontally extending platform 67 mounted for movement in the longitudinal direction by means of suitable ways (not shown). A lead screw 68 is driven by a drive motor 69 through pulleys 71, 72 and a drive belt 73, and a nut assembly 74 is driven by the lead screw and attached to carriage 66. The position of the carriage is detected by an optical encoder comprising an elongated encoder element 76 having light transmissive slots 77 affixed to the carriage and a pair of light source and sensor assemblies 78 mounted in stationary positions adjacent to encoder element 76. The spacing of slots 77 corresponds to the spacing of the wafers and slots in the cassettes, and screws 79 are provided for adjusting the positions of light sources/sensors 78.

Wafer transfer blades 81, 82 are provided for lifting the wafers out of input cassette 61 and into output cassette 62. Each of these assemblies includes a relatively thin, vertically extending bifurcated blade 83 mounted on a horizontally extending arm 84. Arm 84 is affixed to a vertically extending carriage plate 86. Each blade assembly also includes a vertically extending track 87 which is affixed to the back plate 39 of the carriage assembly by a mounting block 88. Each track has a pair of spaced apart rails 89 affixed to the front edges thereof, and a plurality of vertically spaced rollers 91 are mounted on plate 86 and captured between rails 89 whereby the blade is constrained for movement in the vertical direction. A pneumatic cylinder 92 is connected to plate 86 by a coupling link 93 for moving the blade between raised and lowered positions relative to the cassettes on the elevator carriage.

Chuck assemblies 96, 97 are mounted on a horizontally extending track 98 carried by the elevator assembly. Each of the chuck assemblies includes a carriage 99 mounted on the track by suitable rollers for movement in a radial direction. The chucks are moved by independently operable air cylinders 101, 102 between retracted positions above the wafer transfer blades and advanced positions adjacent to the processing trays in the loading and unloading positions, respectively.

As illustrated in FIG. 6, loading chuck 96 comprises a body 106 having a cylindrical bore 107 formed therein. A piston 108 having an enlarged head 109 is mounted in the bore, with an O-ring 111 providing a seal between the piston and the cylinder wall. The piston is urged toward an extended position by a compression spring 112 at the inner end of the cylinder. An axially extending bore 113 extends through the piston, and an O-ring 114 in the face of the piston head provides an air-tight seal between the piston and a wafer carried thereby.

Vacuum pressure is applied to cylinder 107 through a fitting 116, a first passageway 117 in the chuck body, a check valve 118, and a second passageway 119 in body 106. A needle valve 121 controls the communication through an additional passageway 122 which interconnects passageways 117 and 119, bypassing check valve 118. In operation, when a vacuum is applied to fitting 116, a wafer is drawn against the face of the piston, and the piston moves toward its retracted position, overcoming the force of spring 112. When the vacuum is released, cylinder 107 is vented through needle valve 121, the piston travels towards its extended position, and the wafer carried on the face of the piston is released.

Wafer loading chuck 96 also includes means for moving the wafer holding clips 14 on processing trays 12 to an open position so that the wafers can be moved into the wafer holding positions. This means includes four depressor pin assemblies 126 spaced in quadrature about the head of piston 108 in position for engagement with the tray clips. The pin assemblies are mounted on a plate 127 which is affixed to the body 106 of the chuck. The chuck assembly is mounted on carriage 99 by a mounting bracket 129.

The manner in which pin assemblies 126 and clips 14 function is illustrated in FIGS. 5, 5A and 5B. Each clip comprises a rigid body 14a, a spring arm 14b, and a wafer receiving notch 14c formed in the clip body. The body is affixed to one end of the spring arm, and the other end of this arm is affixed to the wafer tray. The body of the clip is positioned in opening 13, with the wafer receiving notch facing inwardly in a radial direction. A beveled face 14b is formed on the clip body adjacent to the notch to provide clearance for movement of the wafer into the notch. Spring arm 14b urges notch 14c in an inward radial direction, and pin 126 causes the spring to flex, moving the notch in an outward direction to receive the wafer. FIG. 5 illustrates the clip in the rest position without the wafer, FIG. 5A illustrates the clip in the wafer holding position, and FIG. 5B illustrates the clip in the open position for receiving or releasing the wafer.

As illustrated in FIG. 7, wafer unloading chuck 97 comprises a body 131 having a cylindrical bore 132 formed therein. A piston 133 having an enlarged head 134 is mounted in bore 132, and O-rings 136, 137 are carried by the piston body and head, respectively. A blind axial bore 138 extends into the body of piston 133 from the outer face of the head, and a vacuum pressure for holding wafers on the face of the piston is applied to this bore through a fitting 139. Piston 133 is urged toward an extended position by a compression spring 141 mounted in an inner bore 142 formed in body 131 at the inner end of bore 132. Vacuum pressure for withdrawing piston 133 to its retracted position is applied to bore 142 through a fitting 143. A seal between bore 142 and the outer portion of bore 132 is provided by an O-ring 144.

Depressor pin assemblies 146 similar to pin assemblies 126 are mounted on a flange 147 affixed to the body 131 of chuck assembly 97. The outward travel of piston 133 is limited by adjustable stops 148 carried by the head of the piston and engageable with the back side of flange 147. This chuck assembly is mounted on its carriage by a mounting flange 149.

In operation, vacuum pressure is applied to fitting 139 to hold wafers on the face of piston 133. In the absence of vacuum pressure at fitting 143, piston 133 is urged toward its extended position by spring 141. When vacuum pressure is applied to fitting 143, the force of the spring is overcome, and the piston moves toward its retracted position. The rate at which the piston travels can be regulated by the rate at which the vacuum is applied and released through fitting 143.

Operation and use of the wafer loading apparatus is as follows. A cassette 61 containing the wafers to be loaded is placed in the side of the cassette holder beneath wafer loading chuck 96. The trays to be loaded are mounted in adjacent ones of the tray receiving positions on one side of the carousel, and the carousel is rotated to bring an empty tray into the loading position adjacent to cassette 61. The elevator assembly is lowered so that chuck 96 is aligned with the lowermost wafer holding position of the tray in the loading position.

To load a wafer into a tray, indexing assembly 66 is actuated to move the wafer to be loaded into position above wafer transfer blade 83. The blade is then raised to lift the wafer to chuck 96, and vacuum pressure is applied to the chuck so that the wafer is transferred from the blade to the chuck. Pneumatic cylinder 101 is then actuated to move the chuck and wafer toward the tray, and as the wafer approaches the holding position, the vacuum is removed from fitting 116, allowing spring 112 to move the wafer and clip depressor pins 126 toward the tray. The pins engage the clips, moving them to their open position, and the wafer is brought into position to be gripped by the clips. With the vacuum removed, the wafer is released by the chuck, and the chuck assembly is withdrawn from the tray by cylinder 101, permitting the clips to close about the wafer. The indexing assembly then moves the cassette to bring the next wafer into position to be loaded, and the elevator is raised to bring the chuck into alignment with the next wafer receiving position. The process repeats until all of the wafers are loaded into the tray, and thereafter the carousel is rotated to bring the next tray into the loading position. When all of the trays have been loaded, they are transported to the reactor where the wafers are processed.

To unload wafers from the trays, an unloaded cassette is placed on the side of the cassette holder beneath wafer unloading chuck 97, and the trays to be unloaded are placed in adjacent ones of the tray receiving positions on the carousel. The carousel is rotated to bring one of the loaded trays into the unloading position adjacent to cassette 62, and the elevator assembly is lowered so that chuck 97 is aligned with the lowermost wafer in the tray in the unloading position. The indexing assembly is actuated to position the first available slot in cassette 62 above the wafer transfer blade on the unloading side of the apparatus. Pneumatic cylinder 102 is actuated to move the chuck in the outward direction toward the tray, and pins 126 engage the clips to release the wafer. Vacuum applied to fitting 139 holds the wafer on the chuck and vacuum is then applied to fitting 143 to withdraw the wafer from the tray. Cylinder 101 is then actuated to move the chuck assembly from the tray to the retracted position. With the chuck assembly in the retracted position, blade 82 is raised, and the vacuum is removed from fitting 139 so that the wafer is transferred from the chuck to the blade. The blade is then lowered, transferring the wafer into the cassette. The cassette is then moved to bring the next available slot into alignment with the blade, and the elevator assembly is raised to bring the chuck into alignment with the next wafer to be removed from the tray. This process continues until all of the wafers are removed from the tray, following which the carousel is rotated to bring the next tray into the unloading position.

The invention has a number of important features and advantages. It permits wafers to be loaded into trays and unloaded from the trays without contact by a human operator. One set of trays can be loaded and unloaded while another is being processed in a reactor, and the basis of the wafers remain vertical throughout the loading and unloading operations to reduce the possibility of particulate contamination falling onto the wafers. All of the wafers move the same distance between the cassette and the tray regardless of their position in the cassette or their location in the tray, thereby enabling fixed positive strokes to be employed by the mechanisms which transfer the wafers between the cassettes and the trays. The cassette assembly moves along the trays, thereby minimizing the wafer transport distance between the cassettes and the trays and reducing the wafer travel time. A single indexing mechanism is shared by both the loading and the unloading cassettes, and contact with the wafers is minimized. By proper orientation of the wafers in the input cassette, the wafers can be handled by their back sides throughout the loading and unloading operation. The loading chuck is a compound acting device, which retracts under vacuum and extends in atmosphere, with the wafer itself being utilized as a sealing member toward the vacuum. Separate, dedicated loading and unloading stations are utilized, and there is no mixing of processed and unprocessed wafers in a given cassette. One complete batch of processed wafers can be unloaded into a cassette before the next loading cycle begins, thereby preventing the mixing of wafers and processing trays. By designing the carousel to have enough tray-receiving positions for two complete sets of trays from a processing reactor, the two sets can be stored on the carousel when the reactor is being serviced. Being relatively compact, the loading apparatus requires a minimum of floor space.

It is apparent from the foregoing that a new and improved apparatus has been provided for loading and unloading wafer trays. While only one presently preferred embodiment has been described in detail, as will be apparent to those familiar with the art, certain changes and modifications can be made without departing from the scope of the invention as defined by the following claims.

We claim:

1. Apparatus for transferring wafers between a storage magazine and processing trays having a plurality of wafer holding positions spaced along the same, comprising a multifaceted generally cylindrical carousel on which the trays are removably mounted with the wafer holding positions aligned generally parallel to the axis of the carousel, drive means for rotating the carousel about its axis to bring successive ones of the trays into a predetermined wafer loading position, an elevator assembly mounted within the carousel for movement in the axial direction between the wafer holding positions, wafer holding chuck means mounted on the elevator assembly for movement in a radial direction toward and from a tray in the wafer loading position, and means for transferring the wafers between the storage magazine and the chuck means.

2. The apparatus of claim 1 wherein the storage magazine is mounted on the elevator assembly.

3. The apparatus of claim 1 wherein means for transferring the wafers between the storage magazine and the chuck means comprises a blade engageable with the edges of the wafers for lifting the wafers out of the magazine into position to be gripped by the chuck means.

4. The apparatus of claim 3 further including indexing means carried by the elevator assembly for moving the storage magazine to position successive ones of the wafer holding positions therein in registration with the wafer transfer blades.

5. The apparatus of claim 2 wherein the wafers are positioned face to face in the magazine, and means is carried by the elevator assembly for turning the wafers to a predetermined rotational position in the magazine.

6. The apparatus of claim 1 wherein input and output magazines are mounted on opposite sides of the elevator assembly, and the chuck means includes first and second chucks moveable in radial directions for carrying wafers from the input magazine to the trays and from the trays to the output magazine, respectively.

7. The apparatus of claim 1 wherein the trays include clips engageable with the wafers for releasably securing the wafers in the wafer holding positions, and the chuck means includes means for moving the clips to an open position to permit the wafers to be inserted into and removed from the trays.

8. The apparatus of claim 1 wherein the chuck means is vacuum operated.

9. Apparatus for transfering wafers between a storage magazine and a processing tray having a plurality of wafer holding positions, comprising a generally cylindrical carousel having a plurality of tray receiving positions disposed circumferentially thereof, an elevator assembly positioned centrally of the tray receiving positions, means for effecting relative rotational and axial movement of the carousel and the elevator assembly whereby the elevator assembly can be aligned selectively with any of the wafer holding positions on any tray mounted on the carousel, and chuck means mounted on the elevator assembly and moveable in a radial direction for carrying wafers between the storage magazine and a selected wafer holding position on one of the trays.

10. The apparatus of claim 9 wherein the storage magazine is mounted on the elevator assembly.

11. The apparatus of claim 10 further including a wafer transfer blade for lifting the wafers out of the magazine into position to be gripped by the chuck means.

12. The apparatus of claim 11 further including indexing means for effecting relative movement of the storage magazine and the wafer transfer blade to position the blade for transferring successive ones of the wafers in the magazine.

13. The apparatus of claim 9 wherein the trays include clips engageable with the wafers for releasably securing the wafers in the wafer holding position, and the chuck means includes means for moving the clips to an open position to permit the wafers to be inserted into and removed from the trays.

14. The apparatus of claim 9 wherein the chuck means is vacuum operated.

15. The apparatus of claim 9 wherein input and output magazines are mounted on opposite sides of the elevator assembly, and the chuck means includes first and second chucks moveable in radial directions for carrying wafers from the input magazine to the trays from the trays to the output magazine, respectively.

16. Apparatus for transferring wafers between storage magazines and processing trays having a plurality of wafer holding positions, comprising a generally cylindrical carousel having a plurality of tray receiving positions disposed circumferentially thereof, an elevator assembly positioned centrally of the tray receiving positions, means for effecting relative rotation and axial movement of the carousel and the elevator assembly whereby the elevator assembly can be aligned selectively with any of the wafer holding positions on any tray mounted on the carousel, means for mounting an input magazine and an output magazine on the elevator assembly, first chuck means mounted on the elevator assembly and moveable in a radial direction for carrying wafers from the input magazine to trays mounted on the tray receiving positions, and second chuck means mounted on the elevator assembly and moveable independently of the first chuck means for carrying wafers from the trays to the output magazine.

17. The apparatus of claim 16 further including moveable blade means for transfering wafers between the respective magazines and chuck means.

18. The apparatus of claim 17 further including means carried by the elevator assembly for moving the wafer magazines to position successive wafer holding positions therein in registration with the wafer transfer blade means.

19. The apparatus of claim 16 wherein the wafers are positioned face to face in the magazines, and means is carried by the elevator assembly for turning the wafers to a predetermined rotational position in the magazine.

20. The apparatus of claim 16 wherein the trays include clips engageable with the wafers for releasably holding the wafers in the wafer holding positions, and the chuck means include means for moving the clips to an open position to permit insertion and removal of the wafers.

21. The apparatus of claim 16 wherein the chuck means are vacuum operated.

* * * * *